United States Patent [19]
Gabor

[11] 4,011,508
[45] Mar. 8, 1977

[54] LOGIC SIGNAL TEST DEVICE FOR INDICATING LOW, INTERMEDIATE AND HIGH LEVEL SIGNALS

[75] Inventor: Robert J. Gabor, Mentor, Ohio

[73] Assignee: A & P Products Incorporated, Painesville, Ohio

[22] Filed: Mar. 24, 1975

[21] Appl. No.: 561,111

[52] U.S. Cl. .................................. 324/133; 324/51
[51] Int. Cl.[2] ................. G01R 31/02; G01R 19/16
[58] Field of Search ............ 324/51, 72.5, 96, 122, 324/133, 53; 340/324 R, 248 A, 248 B, 248 C

[56] References Cited
UNITED STATES PATENTS

| | | | |
|---|---|---|---|
| 1,744,840 | 1/1930 | Strieby et al. | 324/133 X |
| 1,918,834 | 7/1933 | Crago | 324/122 |
| 2,094,645 | 10/1937 | Foulke | 324/122 |
| 2,525,705 | 10/1950 | Moore | 324/122 |
| 2,794,167 | 5/1957 | Jones | 324/53 |
| 2,817,075 | 12/1957 | Muehter | 324/51 X |
| 2,848,685 | 8/1958 | Mondschein | 324/133 X |
| 2,851,659 | 9/1958 | Ladrick | 324/51 X |
| 3,501,698 | 3/1970 | Becknell | 324/51 X |
| 3,525,939 | 8/1970 | Cartmell | 324/72.5 X |
| 3,627,408 | 12/1971 | Fergason | 324/96 X |
| 3,667,039 | 5/1972 | Garfein et al. | 324/96 X |
| 3,829,763 | 8/1974 | Morin | 324/51 |

FOREIGN PATENTS OR APPLICATIONS

| | | | |
|---|---|---|---|
| 1,089,064 | 9/1960 | Germany | 324/122 |

OTHER PUBLICATIONS

Lyons et al., *Light–Emitting Diode Circuit* IBM Technical Disclosure Bulletin vol. 14 No. 12 May 1972 p. 3580.
Watson, S. G., *Polarity Reversing Test Probes* IBM Technical Disclosure Bulletin vol. 16 No. 3 Aug. 1973 p. 836.

*Primary Examiner*—Gerard R. Strecker
*Attorney, Agent, or Firm*—Donnelly, Maky, Renner & Otto

[57] ABSTRACT

A probe for testing logic signals or the like occurring in electric circuits and for indicating whether such signals are at low, intermediate or high level or that an open circuit exists in the tested circuit includes first and second parallel connected display portions, the former having a first liquid crystal indicator in series with a battery the latter including a second liquid crystal. The first liquid crystal is normally energized when the difference between the battery voltage and the received signal being tested exceeds the threshold level thereof, and the second liquid crystal is normally energized when the voltage of the received signal being tested exceeds the threshold level thereof, such energization indicating whether the tested signal is at high or low level. De-energization of both liquid crystals indicates that the tested signal is at an intermediate level, also known as the deadband region between low and high level signals, or that an open circuit exists in the tested circuit.

14 Claims, 3 Drawing Figures

LOGIC SIGNAL TEST DEVICE FOR INDICATING LOW, INTERMEDIATE AND HIGH LEVEL SIGNALS

BACKGROUND OF THE INVENTION

This invention relates to a probe for testing logic signals and more particularly relates to such a device having minimum components for indicating whether a logic signal is at low, intermediate or high level or that an open circuit exists in a tested circuit.

Some prior art probes for testing logic signals have used a single indicator, which upon energization indicates occurrence of a high level electric signal and indicates the occurrence of a low level electric signal when not so energized. Such devices, however, do not provide a positive indication of occurrence of low level signals, nor are they capable of indicating occurrence of a signal in the deadband intermediate region relative to normally occurring low and high level signals.

Test devices for determining whether logic signals occurring in electric circuits are at low or high level, for example respectively representing logic 0 and logic 1, have utilized various types of indicators, such as lamps, light emitting diodes, and the like. Many of the prior art devices have been limited to indicating whether such logic signals are at low or high level without being capable of polarity reversal or providing an indication that a tested circuit is open or that the signal is at an intermediate level, the latter often implying a malfunction in the tested circuit. Moreover, those devices capable of three mode indication, viz, low intermediate and high level signals, have required complex and expensive circuitry to achieve the same and have had relatively high power requirements for energization, as, for example, the device disclosed in U.S. Pat. No. 3,525,939.

Liquid crystals in which the molecules become non-aligned upon application of an electric field at a potential equal to or greater than the threshold level of the liquid crystal have been used as indicators or display elements. In such arrangements, a light source may be located on one side of the liquid crystal, which either blocks or transmits light when de-energized and performs the opposite function when energized. Alternatively, such liquid crystals have been located in front of reflective surfaces, which provide for use of ambient light as the light source. An article in the October, 1973, issue of *Fortune* magazine entitled "What Makes Liquid Crystals Shine" presents some of the unique properties of liquid crystals, and particularly describes the use thereof in displays.

Although liquid crystals have a relatively high resistivity and require very low power for energization, one difficulty in using liquid crystal displays for indicating low level signals is that even though the threshold level for a liquid crystal can be determined during the manufacturing thereof, it becomes increasingly difficult and expensive to manufacture the same as the required threshold level is decreased. Low level logic signals, for example, in positive logic applications are often in the zero to 0.4 volt range, and it is often impossible to obtain a liquid crystal with such a low threshold level.

SUMMARY OF THE INVENTION

The apparatus of the instant invention employs the characteristic threshold level of two substantially identical liquid crystals and a series in connected battery with one of the liquid crystals to provide a positive indication of both the low and high levels of logic signals normally occurring in logic circuitry. Additionally, such apparatus presents an indication that the tested electric signal is in the deadband region, usually implying a fault or an open circuit in the tested circuit. Moreover, the arrangement of elements in the instant invention requires very low power for operation and facilitates polarity reversal using relatively inexpensive high threshold liquid crystal indicators which have current requirements, for example, on the order of microamperes at 10 to 15 volts and are insensitive to polarity.

Accordingly, a primary object of the invention is to provide a test apparatus improved in the noted respects.

Another object of the invention is to indicate positively whether a logic signal is at low or high level.

A further object of the invention is to indicate whether a logic signal in a tested circuit is at low level, high level or either at an intermediate level or that an open circuit condition exists in the tested circuit.

An additional object of the invention is to use a liquid crystal arrangement utilizing relatively inexpensive high threshold level liquid crystals requiring minimum power for indicating whether a logic signal is at low level, high level, or either at an intermediate level or that an open circuit exists in the tested circuit.

Still another object of the invention is to provide a test probe easily adapted for use with positive or negative logic signals to indicate low, intermediate or high levels thereof.

Still a further object of the invention is to provide a test probe which is insensitive to minor voltage variations.

Still an additional object of the invention is to provide a test probe having a minimum number of parts, thus being efficient, relatively inexpensive and less subject to failure than conventional devices.

Even an additional object of the invention is to provide a simplified built-in threshold arrangement for a test probe or the like without the need for further logic circuitry.

These and other objects and advantages of the present invention will become apparent as the following description proceeds.

To the accomplishment of the foregoing and related ends, the invention, then, comprises the features hereinafter fully described, the following description and the annexed drawing setting forth in detail certain illustrative embodiments of the invention, these being indicative, however, of but several of the various ways in which the principles of the invention may be employed.

DESCRIPTION OF THE PREFERRED EMBODIMENT

Figure 1:
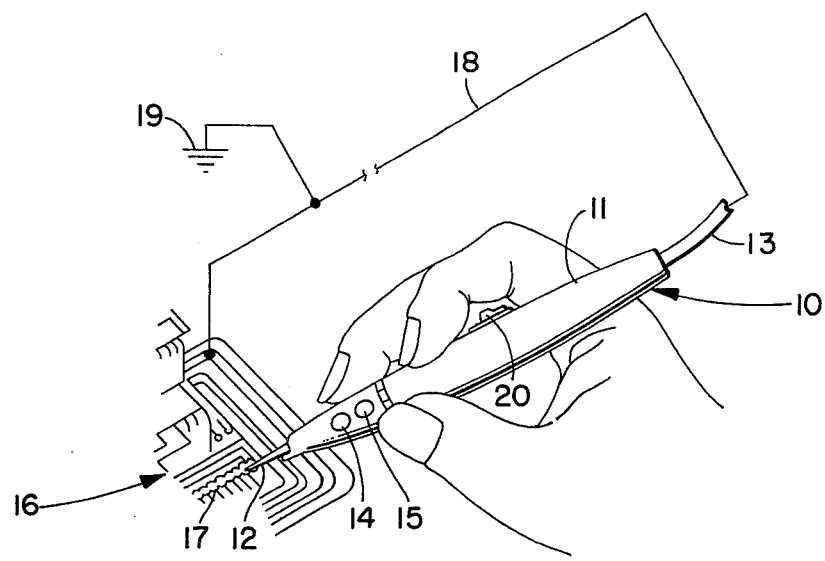
FIG. 1 is an environmental view illustrating a test probe in accordance with the present invention.

Referring now to the drawing wherein like reference numerals refer to like elements in the several figures, and particularly to FIG. 1, a test probe for testing signals occurring in a logic or other circuit is generally indicated at 10. The test probe 10 has a main electrically non-conductive body 11 from which a relatively rigid electrically conductive test tip 12 extends, and an electrical cable 13 extends rearwardly from the main body to provide for external connections, for example to a circuit ground or to an external energy source. Within main body 11, which serves as a handle for the test probe 10, are positioned first and second indicator devices 14, 15, which are preferably liquid crystal indicators, such as those described above, whereby when positive signals are tested energization of the first liquid crystal indicates the tested signal is at low level, energization of the second liquid crystal indicates that the tested signal is at high level and de-energization of both liquid crystals indicates either that the tested signal is in the deadband region or that an open circuit condition exists in the tested circuit, as will become more apparent below. Moreover, when negative signals are tested, energization of the opposite liquid crystals indicates respectively low and high level tested signals. If desired, other types of indicators or displays may be utilized provided that such devices either by themselves or in conjunction with additional means are capable of energization or change of state only at and above a respective threshold level.

As shown in FIG. 1, the circuit 16 to be tested by the test probe 10 includes a number of printed circuits, each of which has a respective test point 17, at which a logic signal occurring in the former is provided for easy application to the test tip 12 of the test probe 10, for example, by touching the test tip to the test point. The test probe 10, however, may be conveniently used to test signals occurring in other types of circuits with or without specified test points since the test tip 12 can be readily touched and connected to any available wire or other conductive portion of a circuit to indicate whether the signals occurring in therein are at low, intermediate or high level or whether an open circuit condition exists therein.

A line 18 from the electrical cable 13 of the test probe 10 provides a connection to a point 19 of relative ground potential of the tested circuit 16. A conventional polarity reversing switch 20 is conveniently located on the main body portion of the test probe for adapting the same for use with either positive or negative logic, as will become more apparent below.

Figure 2:
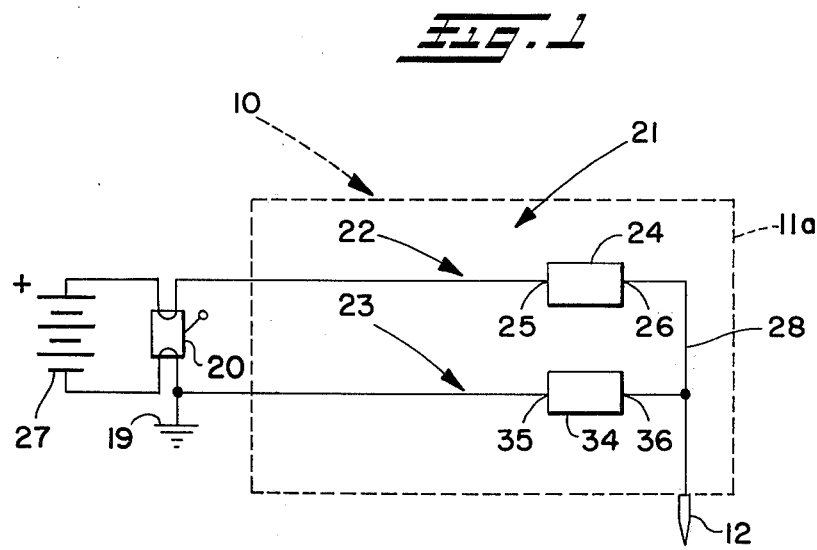
FIG. 2 is a schematic diagram of the electrical connections for the elements of the test probe utilizing an external power supply.

Turning now more particularly to FIG. 2, the connections for the test probe 10 are indicated generally at 21 for use to test positive signals and located relative to the test probe body schematically illustrated by dashed line 11a are a first low level indicating portion 22 and a second high level indicating portion 23. The low level indicating portion 22 includes a first liquid crystal 24 having first and second electrical terminals 25, 26, the former being connected through the polarity reversing switch 20 to a battery 27 or other source of electric energy and the latter being connected to a lead 28 which is coupled to the test tip 12 for receiving logic signals occurring in the tested circuit 16. The positive terminal of the battery 27 is shown connected to terminal 25 of the liquid crystal 24 since the polarity of the received tested signals having maximum absolute magnitude is also positive. When negative signals are tested, whereby the polarity of the signal having maximum absolute magnitude is negative, the negative battery terminal is coupled to the liquid crystal 24, as is shown, for example, in FIG. 3.

Figure 3:
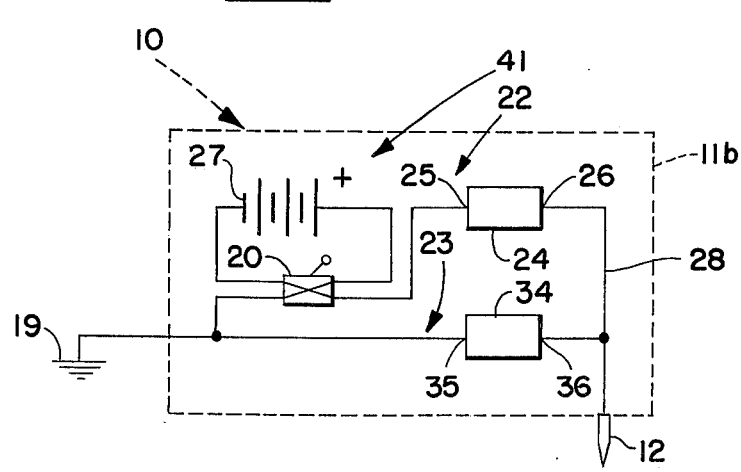
FIG. 3 is a schematic diagram of the electrical connections for the elements of the test probe utilizing an internal power supply.

The polarity reversing switch 20 may be, for example, a conventional two pole double throw switch, which in a first position thereof provides a direct connection between the positive terminal of the battery 27 and the terminal 25 of the liquid crystal 24, as shown in FIG. 2, and in the second position provides a direct connection between such liquid crystal and the negative terminal of the battery, as shown in FIG. 3, with the other battery terminal in each case being connected to the circuit ground 19. Preferably, the voltage provided by the battery 27, which could also be any other source of DC electrical energy, is of a magnitude approximately equal to the difference between the voltages of the high and low level signals to be tested, and the threshold level of the first liquid crystal 24 is preferably equal to the difference between the battery voltage and the voltage of the low or high level tested signal having the lowest absolute magnitude.

The second indicating portion 23 of the test probe 10, which is connected in parallel with the first indicating portion 22, includes the second liquid crystal 34, having electrical terminals 35, 36 connected thereto and respectively to the circuit ground 19 and to the lead 28. The threshold level of the second liquid crystal 34 is preferably approximately equal to the voltage of the tested signal having maximum absolute magnitude.

Thus, for example, in a logic circuit using positive logic the normal high level or logic 1 signal may be a positive 10 volts, which would be the threshold level of the second liquid crystal 34, and a low level or logic 0 signal may be ground potential, whereby the voltage difference between high and low level signals of 10 volts would be the threshold level of the first liquid crystal 24 and the voltage of the battery 27. Since the voltage representing a high level signal may be in a range of, for example, 6 to 10 volts, it may be desirable to use a second liquid crystal having a threshold level of 6 volts; and if the low level signal voltage also falls within a range of, for example, zero to 0.4 volts, the threshold level of the first liquid crystal may be the difference between the battery voltage and that of the high end of such latter range.

The liquid crystals 24 and 34 and the lead 28 are shown in FIG. 2 surrounded by a dashed line 11a, which represents the main body portion 11 of the test probe 10 to indicate that such elements are located interiorly thereof. Moreover, the polarity reversing switch 20 may be located on the main body portion of the test probe as shown, for example, in FIG. 1, or such switch may be located remote from the test probe 10, for example, in proximity to the battery or other source of electrical energy 27. Alternatively, the polarity reversing switch 20 may be eliminated, whereby polarity reversal of the test probe may be effected simply by reversing connection of the battery or source of electrical energy 27 to the liquid crystal 23 and circuit ground 19. The liquid crystals 24, 34, may be the type that use a reflective backing, which reflects ambient light when the molecules are in the proper state, or an independent light source, not shown, may be located within the test probe 10 to provide illumination through such liquid crystals with energy for the light source being provided either by the battery 27 or from another supply, not shown.

The embodiment of the invention in which the connections 41 are illustrated in FIG. 3, is quite similar to that of FIG. 2, with the exception that the battery 27 is located internally of the main body portion represented by the dashed line 11b of the test probe 10 and the polarity reversing switch is thrown to a position for testing negative signals. In such arrangement the first indicating portion 22, including the first liquid crystal 24 and the battery 27, as well as the second indicating portion 23, including the liquid crystal 33, are located entirely within the test probe with the test tip 12 providing a connection to the circuit to be tested, whereby signals therefrom are received on the lead 28 and applied to the respective indicating portions.

In operation of the test probe 10 the polarity reversing switch 20 is adjusted to the proper position for use with positive or negative logic, and the test tip 12 is located in connection with a test point on which electrical signals, such as logic signals, normally occur. If the difference between the signed voltage received on the lead 28 and that of the electrical energy source or battery 27 is greater than the threshold level of the first liquid crystal 24, then the latter becomes energized whereby the molecules thereof become non-aligned to provide an indication of a low signal occurrence when positive signals are tested or high level signal occurrence when negative signals are tested. When the difference between the battery voltage and that of the tested signal is below the threshold level of the liquid crystal 24, the latter remains in its de-energized state. Moreover, when the voltage of the received electrical signal on the lead 28 exceeds the threshold level of the liquid crystal 34, the latter changes from its de-energized to its energized state to indicate occurrence of such signals.

Moreover, if an open circuit exists in the tested circuit whereby no signal is received on the lead 28 or if the above-mentioned voltage difference and the voltage of the tested signal are below the respective threshold levels of the liquid crystals 24, 34, then both liquid crystals will be de-energized. Thus, an indication that the received electrical signal is in the deadband region or that an open circuit is occurring in the tested circuit is provided when both liquid crystals 24 and 34 are de-energized.

The embodiments of the invention in which an exclusive property or privilege is claimed are defined as follows:

1. An electric signal testing device for indicating whether an electrical signal in a circuit being tested is at low, intermediate or high level comprising:
   means for receiving such electrical signal; first and second indicator portions connected in parallel with each other and in series with said means for receiving and a relative ground connection, said first indicator portion comprising a first threshold indicator and an electric energy source having positive and negative sides and connected in electrical circuit relation with said first threshold indicator, and said second indicator portion comprising a second threshold indicator; said first and second threshold indicators having respective energized and de-energized states with a change of state occurring at respective threshold levels; whereby energization of said first threshold indicator indicates such electrical signal being at one of such low or high levels, energization of said second threshold indicator indicates such electrical signal being at the other one of such low or high levels, and such intermediate level being indicated by said first and second threshold indicators being in respective de-energized states.

2. The device of claim 1, further comprising means for housing said first and second threshold indicators.

3. The device of claim 2, wherein said means for housing comprises an electrically non-conductive body and an electrically conductive tip portion extending from said body for connection to a circuit to be tested, said electrically conductive tip portion being coupled to said means for receiving in said body.

4. The device of claim 3, further comprising means for connecting said first and second indicator portions to a source of relative ground potential of the circuit being tested.

5. The device of claim 3, wherein said electric energy source comprises a battery located in said body and electrically connected in series circuit relation with said first threshold indicator.

6. The device of claim 5, further comprising a polarity reversing switch for connecting said battery to said first threshold indicator, said polarity reversing switch being adjustable to provide an electrical connection between the positive or negative side of the battery and the first threshold indicator, the other side of the battery being connected to a source of relative ground potential of the circuit being tested.

7. The device of claim 6, wherein said first and second threshold indicators comprise respective first and second liquid crystals.

8. The device of claim 1, wherein said first and second threshold indicators comprise respective first and second liquid crystals.

9. The device of claim 8, further comprising means for connecting said first and second indicator portions to a source of relative ground potential of the circuit being tested.

10. The device of claim 9, further comprising a polarity reversing switch for connecting said electric energy source to said first threshold indicator, said polarity reversing switch being adjustable to connect either the positive or negative side of said electrical energy source to said first threshold indicator with the other respective side being connected to a source of relative ground potential of the circuit being tested.

11. The device of claim 1, further comprising a polarity reversing switch for connecting said electric energy source to said first threshold indicator, said polarity reversing switch being adjustable to connect either the positive or negative side of said electric energy source to said first threshold indicator with the other respective side being connected to a source of relative ground potential of the circuit being tested.

12. The device of claim 1, wherein the magnitude of the voltage of said electric energy source is approximately equal to the voltage difference between such high and low level electrical signals, the threshold level of said first threshold indicator is approximately equal to the voltage difference between that of said electric energy source and the voltage of such low or high electrical signal having a smaller absolute magnitude, and the threshold level of said second threshold indicator is approximately equal to the voltage of such low or high level electrical signal having a larger absolute magnitude.

13. The device of claim 1, wherein said electric energy source is connected in series with said first threshold indicator in polarity opposition to the tested electrical signal.

14. The device of claim 1, wherein said electric energy source comprises a dc source connected in series circuit relation with said first threshold indicator.

* * * * *

UNITED STATES PATENT OFFICE
CERTIFICATE OF CORRECTION

PATENT NO. : 4,011,508
DATED : March 8, 1977
INVENTOR(S) : Robert J. Gabor

It is certified that error appears in the above-identified patent and that said Letters Patent are hereby corrected as shown below:

On the cover page of the patent, the name of the Assignee "A & P Products Incorporated" should read — A P Products Incorporated—.

Signed and Sealed this

Seventeenth Day of May 1977

[SEAL]

Attest:

RUTH C. MASON
Attesting Officer

C. MARSHALL DANN
Commissioner of Patents and Trademarks